(12) United States Patent
Sekiguchi et al.

(10) Patent No.: US 7,247,890 B2
(45) Date of Patent: Jul. 24, 2007

(54) SEMICONDUCTOR DEVICE AND MANUFACTURING METHOD THEREOF

(75) Inventors: Tomoko Sekiguchi, Hino (JP); Shinichiro Kimura, Kunitachi (JP); Renichi Yamada, Fuchu (JP); Kikuo Watanabe, Sayama (JP); Hiroshi Miki, Tokyo (JP); Kenichi Takeda, Tokorozawa (JP)

(73) Assignee: Hitachi, Ltd., Tokyo (JP)

( * ) Notice: Subject to any disclaimer, the term of this patent is extended or adjusted under 35 U.S.C. 154(b) by 270 days.

(21) Appl. No.: 10/931,119

(22) Filed: Sep. 1, 2004

(65) Prior Publication Data

US 2005/0098813 A1    May 12, 2005

(30) Foreign Application Priority Data

Nov. 10, 2003    (JP) ............................. 2003-379851

(51) Int. Cl.
*H01L 31/0328* (2006.01)
*H01L 29/80* (2006.01)

(52) U.S. Cl. ...................... 257/192; 257/296; 257/300; 257/219

(58) Field of Classification Search ................ 257/288, 257/411, 408, 314, 197, 336, 192, 296, 300, 257/20, 219, 213

See application file for complete search history.

(56) References Cited

U.S. PATENT DOCUMENTS 7,078,776 B2 *   7/2006   Nishinohara et al. ....... 257/408
7,081,649 B2 *   7/2006   Watanabe et al. ........... 257/288

FOREIGN PATENT DOCUMENTS

JP   8-330439      5/1995
JP   10-56147      8/1996
JP   2000-236074   10/1999

* cited by examiner

*Primary Examiner*—Howard Weiss
*Assistant Examiner*—(Vikki) Hoa B. Trinh
(74) *Attorney, Agent, or Firm*—Reed Smith LLP; Stanley P. Fisher, Esq.; Juan Carlos A. Marquez, Esq.

(57) ABSTRACT

Disclosed is herein a semiconductor device having a DRAM with less scattering of threshold voltage of MISFET in a memory cell and having good charge retainability of a capacitor, and a manufacturing method of the semiconductor device. An anti-oxidation film is formed to the side wall of a gate electrode before light oxidation thereby suppressing the oxidation of the side wall for the gate electrode and decreasing scattering of the thickness of the film formed to the sidewall in an asymmetric diffusion region structure in which the impurity concentration of an n-type semiconductor region and a p-type semiconductor region on the side of the data line is made relatively higher than the impurity concentration in the n-type semiconductor region and p-type semiconductor region on the side of the capacitor, respectively.

5 Claims, 8 Drawing Sheets

SEMICONDUCTOR DEVICE AND MANUFACTURING METHOD THEREOF

CLAIM OF PRIORITY

The present application claims priority from Japanese application JP 2003-379851 filed on Nov. 10, 2003, the content of which is hereby incorporated by reference into this application.

BACKGROUND OF THE INVENTION

1. Field of the Invention

The present invention relates to a semiconductor device having a DRAM of excellent data retention characteristics and with less scattering of threshold voltage of an MISFET in a memory cell, as well as a method of manufacturing such a semiconductor device.

2. Description of the Related Art

One of most important technical subjects in DRAM is how to retain static charges (data) stored in capacitors for a long time. The charge leak path mainly includes the following three routes. That is, they include pn-junction that is connected to one side of a capacitor, a channel region of the MISFET in the memory cell and capacitor itself.

While miniaturization of devices has been progressed with an aim of increasing the integration degree and saving power consumption in DRAM, it results in lowering of a threshold voltage of the MISFET in the memory cell due to the short channel effect. When the threshold voltage lowers, it leads to a significant problem of leakage of charges due to the sub-threshold leak.

As a method of controlling the threshold voltage of the MISFET in the memory cell several methods have been proposed. For example, Japanese Patent Laid-open No. 8-330439 proposes a method of implanting impurities having a conduction type similar to that of a semiconductor substrate, thereby controlling the threshold voltage. To increase the threshold voltage to such a level as not resulting in the problem of the sub-threshold leak, the impurity concentration at the surface of the semiconductor substrate has to be increased to a level as high as $10^{18}$ cm$^{-3}$ or more.

However, this forms a pn-junction between a diffusion region and the channel that high electric field resulting in a problem of increasing the leakage of static charges by the pn-junction leak. As described above, the countermeasure for the prevention of the sub-threshold leakage is in a trade off relation with increase of the pn-junction leak.

As a counter measure for solving the problem described above, Japanese Patent Laid-open Nos. H10-56147 and 2000-236074 describe structures in which the distribution of impurities in the diffusion region is asymmetrical. The structure is hereinafter referred to as an asymmetrical diffusion region structure.

The method described in Japanese Patent Laid-open No. H10-056147 has a feature of implanting impurities (for example, boron ions) having a conduction type identical with that of the channel only to the diffusion region on the side of a data line, thereby increasing the threshold voltage of the MISFET in the memory cell. The sub-threshold leak is suppressed by increasing the threshold voltage. Further, since the concentration of the impurities on the side of the capacitor is not increased, it is possible to decrease the pn-junction leak on the side of the capacitor that causes charge leakage compared to the case that impurities are implanted symmetrically, and improve the charge retention characteristics.

However, this method causes increase of the implantation dose of the impurities introduced on the side of the data line for the control of the threshold voltage of the MISFET in the memory cell. This consequently causes offset between the gate electrode and the diffusion region region on the side of the data line. In this case, offset means that an overlap region between the gate electrode of the MISFET and the diffusion region of the dataline side disappears. Then, with an aim of preventing the offset, a method of introducing impurities of a conduction type identical with that of the channel region and impurities of a conduction type identical with that of the diffusion region only on the side of the data line has been proposed by the technique described in JP-A No. 2000-236074.

However, as a result of the study on the asymmetrical diffusion region structure made by the present inventor, it has been found that this results in a problem of increasing the scattering of the threshold voltage of the MISFET in the memory cell. Depending on the implantation condition of the impurity ions introduced on the side of the data line, the scattering (variation) of the threshold voltage reaches twice as large as that in the usual (symmetrical) structure.

When the threshold voltage is excessively low, sub-threshold leak occurs to cause leakage of charges stored in the capacitor. On the other hand, when the threshold voltage increases excessively, introduction of charges to the capacitor through the MISFET becomes insufficient to cause insufficiency in information writing. Increase of scattering of the threshold voltage means increase in the number of defective bits, which results in lowering of yield.

The result of the simulation study on the cause of the scattering of the threshold voltage of the MISFET in the memory cell is to be described. FIG. 2 and FIG. 3 show how the scattering of the shape at the periphery of a gate electrode gives an effect on the scattering of the threshold voltage. The parameters taken into consideration here are a gate length, inclination of a gate electrode (gate taper angle), a gate oxide film thickness, oxide film thickness for gate electrode side wall, a through oxide film thickness, a side wall spacer film thickness and reduction of tungsten silicide gate during oxidation, which are schematically shown in FIG. 2.

After forming a gate oxide film 20 comprising a silicon oxide film by thermal oxidation on a semiconductor substrate 1, a polycrystalline silicon film 21, a tungsten silicide film 22, and a silicon nitride film 23 are deposited successively. Then the silicon nitride film 23, the tungsten silicide film 22 and the polycrystalline silicon film 21 are delineated by dry etching successively each into a desired gate length by using a photoresist pattern as a mask to form a gate electrode 27. Heat treatment in an oxidation atmosphere (light oxidation treatment) is applied to form a gate electrode side wall oxide film 24 and a through oxide film 25. Then a sidewall spacer 26 comprising a silicon nitride film is formed on the side wall of the gate electrode 27 by a CVD method. The gate length is a length of the polycrystalline silicon gate electrode. Scattering in each of the gate length, the inclination of the gate electrode (gate taper angle) and the retrogression amount of tungsten silicide are mainly caused in the dry etching step upon forming the gate electrode 27. Further, scattering in the thickness of the gate electrode side wall oxide film 24 and the through oxide film 25 is caused mainly in the light oxidation step. The scattering in the thickness of the side wall spacer 26 is caused in the step of forming the side wall spacer 26. Ion implantation of impurities are conducted appropriately in two steps just after light oxidation and just after forming the side wall spacer.

FIG. 3 shows the percentage of the scattering in each shape for the total amount of the scattering of the threshold voltage in comparison between a usual structure and the asymmetrical diffusion region structure. Scattering of the shape results in the scattering of the distribution of impurities implanted in a semiconductor substrate and this fluctuates the threshold voltage of the MISFET. It can be seen that the effect of the scattering of the gate length is large in the usual structure, whereas the effect of the scattering in the thickness of the gate electrode side wall oxide film 24 is large in the asymmetrical diffusion region structure. When the gate length is as small as about 0.1 μm, the short channel effect becomes larger to increase the effect of the scattering of the gate length on the threshold voltage in the usual structure. On the contrary, it is considered that in the asymmetrical diffusion region structure, since impurity ions of a conduction type identical with that of the channel are implanted on the side of the data line, the short channel effect is decreased.

In the case of the asymmetrical diffusion region structure, boron ions and arsenic ions, for example, are implanted only to the diffusion region on the side of the data line at a position apart from the gate electrode by thickness of the gate electrode side wall oxide film. The threshold voltage is highly sensitive to the distribution of the impurities. When the concentration of boron is excessively high, this likely results in offset to increase the threshold voltage. When the concentration of arsenic is excessively high, the threshold voltage is lowered by the short channel effect. Since the scattering in the thickness of the gate electrode side wall oxide film changes the distribution of the impurities, the threshold voltage varies greatly. Accordingly, in order to decrease the scattering of the threshold voltage in the asymmetrical diffusion region structure, it is important to control the scattering of the thickness of the gate electrode side wall oxide film.

The gate electrode side wall oxide film 24 is formed in a so-called light oxidation. Light oxidation is a treatment of thermally oxidizing a semiconductor substrate again after the fabrication of a gate electrode with an aim of removing etching damages in the substrate at the gate edge upon fabrication of the gate electrode. This is an indispensable step for providing a semiconductor device with high reliability. While the gate electrode 27 is formed as a stacked structure of a polycrystalline silicon film 21 with addition of impurities and a tungsten silicide film 22, those portions where the films are exposed (lateral side of the gate electrode) are also oxidized simultaneously in the light oxidation.

The following two reasons may be considered for the scattering of the thickness of the gate electrode side wall oxide film formed by light oxidation.

The first is the dependence of the oxidation speed on the impurity concentration. In the polycrystalline silicon film 21, impurities, for example, phosphorus are added with aim of lowering the resistance. It has been known that the oxidation speed for polycrystalline silicon with addition of impurities such as phosphorus is increased by about 1.5 to 6 times compared with that for polycrystalline silicon with no addition of impurities. Accordingly, as the concentration of the impurities in the polycrystalline silicon is different, the oxidation speed differs correspondingly. This is one of the factors of causing scattering in the thickness of the gate electrode side wall oxide film.

The other is the dependence of oxidation speed on the crystal face orientation. The oxidation speed of the silicon crystal is different depending on the crystal face. For example, the (111) crystal face of silicon has an oxidation speed twice as high as the (100) crystal face. In the polycrystalline silicon used for the gate electrode, since crystal grains having various crystal face orientations are present, they cause scattering in the thickness of the side wall oxide film.

As described above, to decrease the scattering of the threshold voltage of the MISFET in the memory cell in the asymmetrical diffusion region structure, it is necessary to decrease the scattering of the thickness of the gate electrode side wall oxide film. However, since the gate electrode is formed of polycrystalline silicon with addition of impurities and the oxidation speed is different depending on the concentration of impurities and the orientation of crystal grains, scattering in the thickness of the oxide film formed to the gate electrode side wall is increased inevitably.

SUMMARY OF THE INVENTION

The present invention intends to provide a semiconductor device capable of suppressing the scattering of thickness of the gate electrode side wall oxide film which causes scattering of the threshold voltage of an MISFET in a memory cell in an asymmetrical diffusion region structure, as well as a method of manufacturing such a semiconductor device. It further intends to provide a semiconductor device having a DRAM cell with improved refreshing characteristics and having high reliability, as well as a method of manufacturing such a semiconductor device.

A semiconductor device according to the invention having, on a semiconductor substrate, a memory cell in which an information transfer data line, an MISFET and an information storage capacitor portion connected in series, having a structure in which the concentration of impurities in one diffusion region region of the MISFET in connection with the information transfer data line is higher than the concentration of impurities in another diffusion region of the MISFET in connection with the information storage capacitor portion (asymmetrical diffusion region structure), and having an anti-oxidation film on the side wall of the gate electrode of the MISFET.

A semiconductor device according to the invention had, on a semiconductor substrate, a memory cell in which an information transfer data line, an MISFET and an information storage capacitor portion connected in series, has a structure in which the concentration of impurities in one diffusion region of the MISFET in connection with the information transfer data line is higher than the concentration of impurities in another diffusion region of the MISFET in connection with the information storage capacitor portion (asymmetrical diffusion region structure), and has an oxide film formed by a method other than thermal oxidation on the side wall of the gate electrode of the MISFET.

According to the invention, scattering of the threshold voltage of the MISFET in the memory cell which gives a problem in the asymmetrical diffusion region structure can be decreased and a semiconductor device having a highly reliable asymmetrical diffusion region structure can be provided.

BRIEF DESCRIPTION OF THE DRAWINGS

Preferred embodiments of the present invention will be described in details based on the drawings, wherein.

DESCRIPTION OF THE PREFERRED EMBODIMENTS

The purpose of decreasing the scattering of the threshold voltage of the MISFET in a memory cell in DRAM having an asymmetrical diffusion region structure has been achieved by forming an anti-oxidation film to the side wall of a gate electrode of MISFET.

The present invention is to be described by way of embodiments with reference to the drawings.

Embodiment 1

Figure 1:
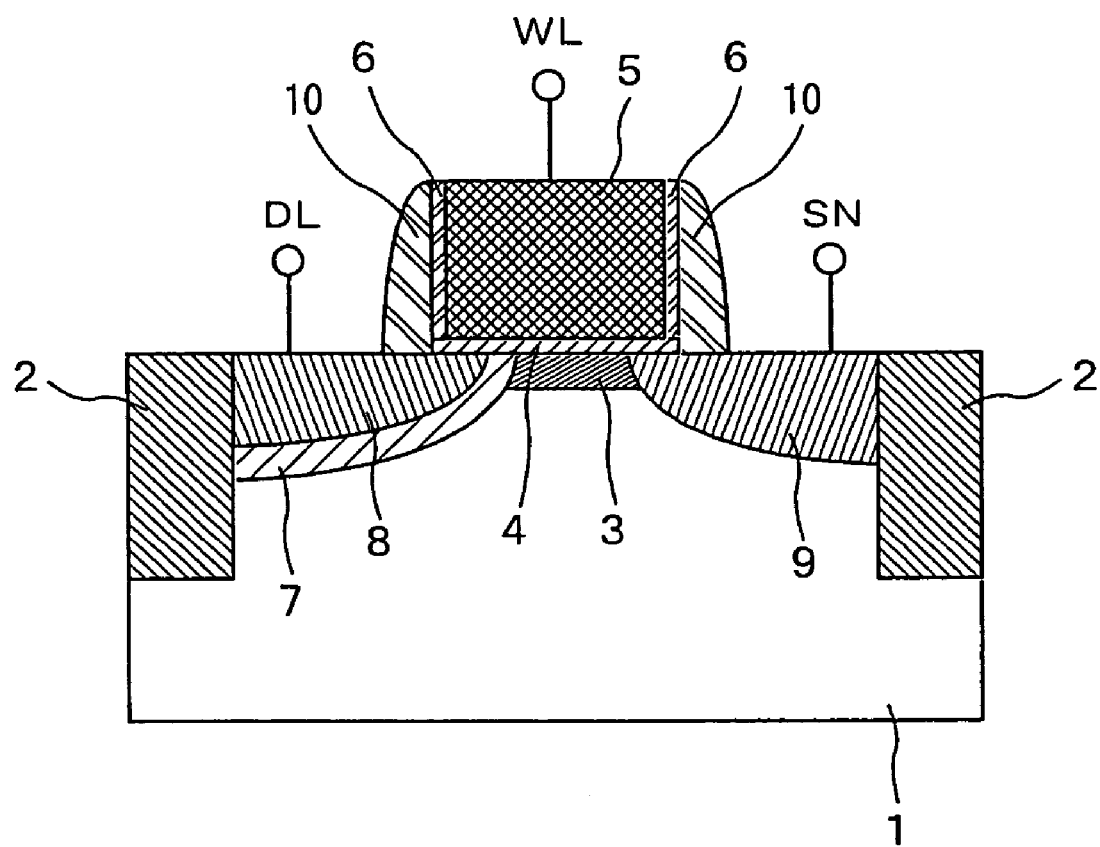
FIG. 1 is a cross sectional view showing an embodiment of a semiconductor device according to the invention.
Figure 2:
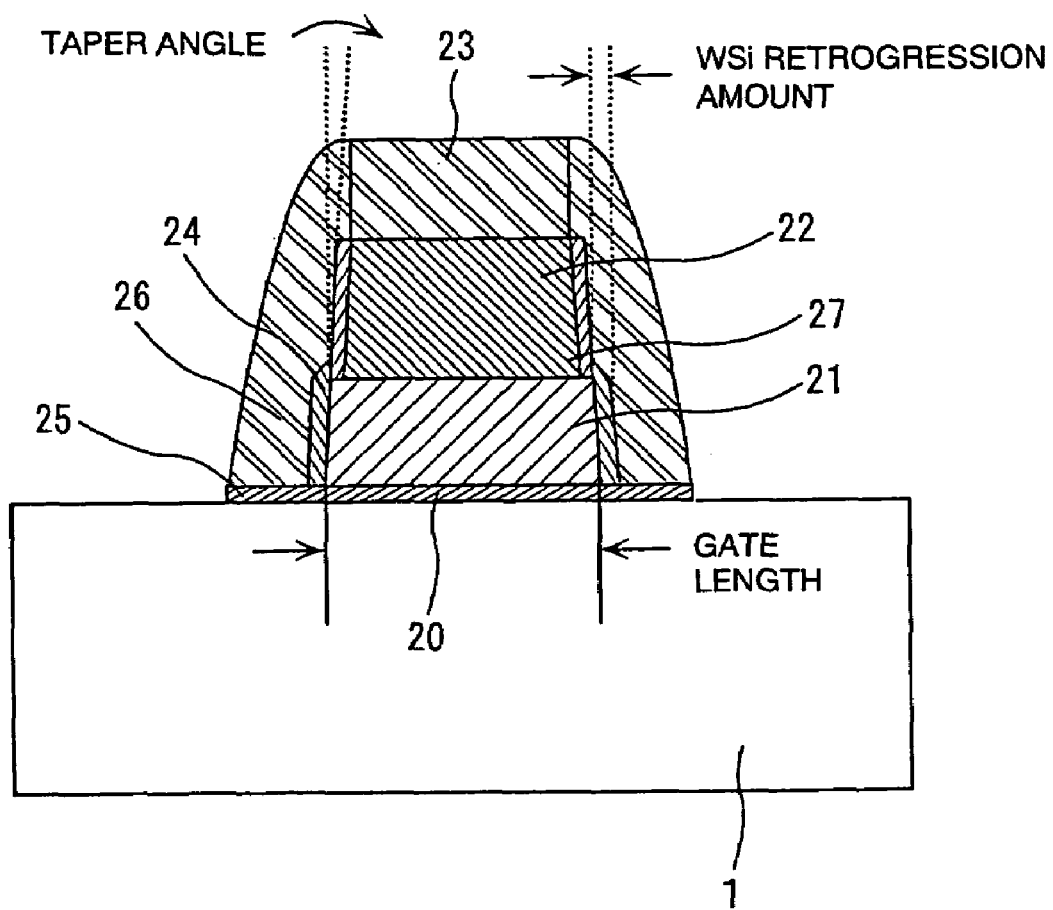
FIG. 2 is an explanatory view for the shape of an MISFET in a memory cell in view of calculation on the scattering of threshold voltage.
Figure 3:
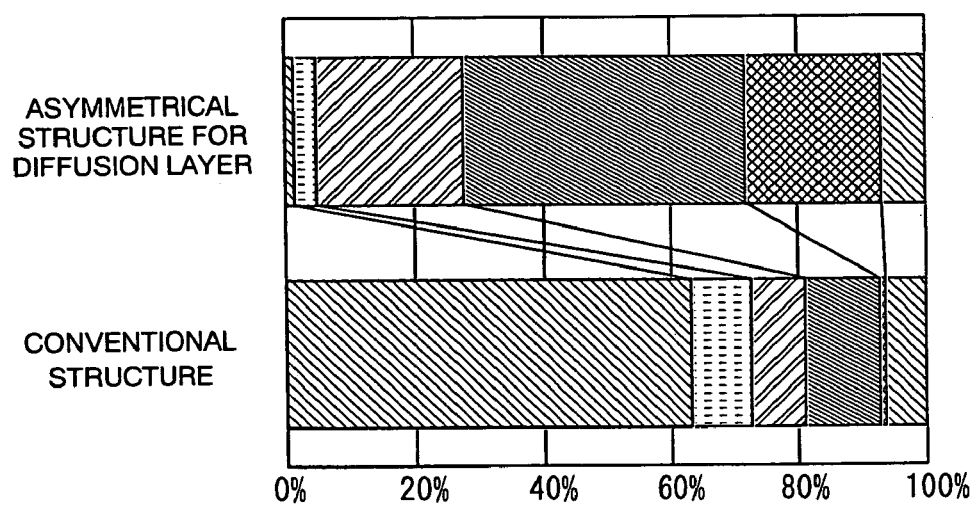
FIG. 3 is a view showing the effect of the scattering of shape on the scattering of the threshold voltage of an MISFET in a memory cell.

FIG. 1 is a cross sectional view showing an embodiment of a semiconductor device according to the invention, which shows MISFET in a memory cell.

In a semiconductor device shown in FIG. 1, a trench isolation 2 comprising a silicon oxide film is formed in a semiconductor substrate 1 comprising silicon single crystal. A p-type semiconductor region 3 is formed on the surface of the semiconductor substrate 1, and a gate dielectric film 4 comprising silicon oxide and a gate electrode 5 are formed on the p-type semiconductor region 3. The gate electrode 5 is formed of polycrystalline silicon with addition of phosphorus and tungsten silicide is stacked thereover with an aim of lowering the resistance. The gate electrode 5 has a function as a word line (WL) for selecting a memory cell. An anti-oxidation film 6 is formed to the side wall in the gate length direction of the gate electrode 5, for example, by a CVD method and no oxide film is formed between the gate electrode 5 and the anti-oxidation film 6. The anti-oxidation film 6 is formed before ion implantation of impurities forming the source and drain of the MISFET. In one region forming the source and drain of the MISFET, a p-type semiconductor region 7 and an n-type semiconductor region 8 are formed with an aim of controlling the threshold voltage of the MISFET and, further, an n-type semiconductor region 9 is formed in the other region forming the source and the drain. The concentration of the p-type impurities in the p-type semiconductor region 7 is higher than the concentration of the p-type impurities in the p-type semiconductor region 3. The concentration of the n-type impurities in the n-type semiconductor region 8 is higher than the concentration of the n-type impurity in the n-type semiconductor region 9. The one region forming the source and drain comprising the p-type semiconductor region 7 and the n-type semiconductor region 8 is connected by way of a plug, for example, comprising polycrystalline silicon with addition of n-type impurities to a data line (DL). Further, the n-type semiconductor region 9 is connected with a capacitor (SN) for storing static charges by way of a plug comprising, for example, polycrystalline silicon with addition of n-type impurities. A side wall spacer 10 comprising a silicon nitride film is formed on the side wall in the gate length direction of the anti-oxidation film 6.

The structure described above has a feature in that the distribution of impurities is different between the source and the drain of the MISFET in the memory cell, the anti-oxidation film 6 is formed to the side wall of the gate electrode 5 before implantation of impurities to the source and drain and no oxide film is present at the boundary between the gate electrode 5 and the anti-oxidation film 6.

This enables to remove scattering in the thickness of the side wall oxide film of the gate electrode which causes a most significant effect on the scattering of the threshold voltage of the MISFET in the memory cell in the asymmetrical diffusion region structure. Since the anti-oxidation film formed on the side wall of the gate electrode is not formed by direct chemical reaction between the gate electrode material and oxygen, it is free from the effect that oxide growth rate varies on the polycrystalline gate electrode surface, resulting in oxide thickness variation. Accordingly, since the scattering on the thickness of the anti-oxidation film can be made sufficiently smaller than that in the existent gate electrode side wall oxide film, it is possible to provide a semiconductor device having an asymmetrical diffusion region structure with less scattering of the threshold voltage of the MISFET in the memory cell.

Then, manufacturing steps for an embodiment of the semiconductor device according to the invention is to be described with reference to the FIG. 4 to FIG. 10.

Figure 4:
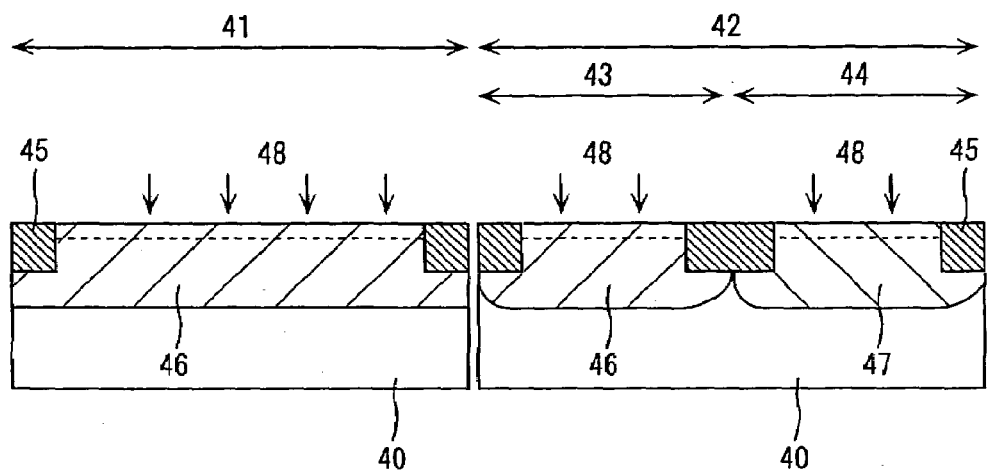
FIG. 4 is a cross sectional view showing a manufacturing step in a preferred embodiment of a semiconductor device according to the invention.

At first, as shown in FIG. 4, a trench at a depth of about 0.4 μm was formed to a portion as a device isolation trench on a p-type silicon substrate 40 having a (100) face orientation with a specific resistivity of 10 Ωcm, and then a silicon oxide film was buried in the trench to form a trench isolation 45.

Then, boron ions, for example, were implanted to a memory array section 41 and an n-type MISFET forming portion 43 in a peripheral circuit portion 42 to form p-well regions 46. Further, phosphorus, for example, was implanted to a p-type MISFET forming portion 44 in the peripheral circuit portion 42 to form an n-type well region 47. After implanting the impurities, a heat treatment was applied with an aim for the recovery of crystal defects caused by ion implantation to the silicon substrate 40 and activation of implanted impurity ions.

Then, impurity ions 48, for example, boron for voltage control were implanted to the surface of the p-type well region 46, and the n-type well region 47 with an aim of controlling the threshold voltage of the MISFET.

Figure 5:
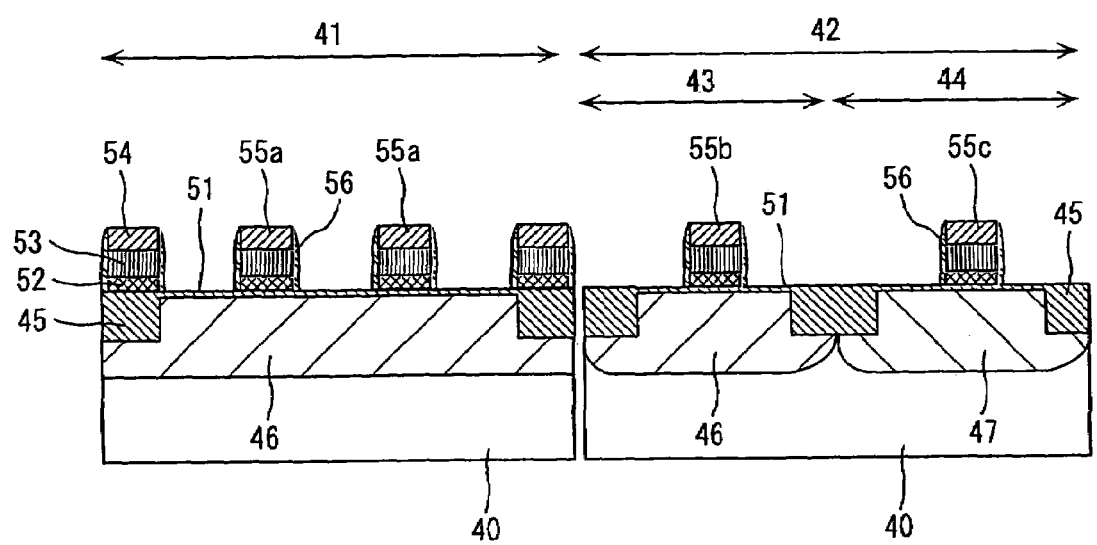
FIG. 5 is a cross sectional view showing a manufacturing step in a preferred embodiment of a semiconductor device according to the invention.

Then, as shown in FIG. 5, after forming a clean silicon oxide film 51 of about 8 nm thickness using a light oxidation method to each of the surfaces of the p-type well region 46 and the n-type well region 47, and forming a polycrystalline silicon film 52 of about 50 nm thickness thereover, a tungsten silicide film 53 of about 100 nm thickness and a silicon nitride film 54 of about 200 nm thickness were deposited successively. Subsequently, the silicon nitride film 54, the tungsten silicide film 53, and the polycrystalline silicon film 52 were etched successively by using a photoresist pattern as a mask to form gate electrodes 55a, 55b, and 55c. Then, a silicon nitride film, for example, was deposited over the silicon substrate 40 by a CVD method and etched anisotropically to form an anti-oxidation film 56 to about 10 nm on the side wall of the gate electrodes 55a, 55b and 55c. Then, a heat treatment was applied in an oxidative atmosphere. This is a so-called light oxidation. This can recover etching damages to the gate oxide film at the gate edge. In this step, since the anti-oxidation film was formed on the side wall of the gate electrode, no oxide film was formed on the side wall of the gate electrode.

Figure 6:
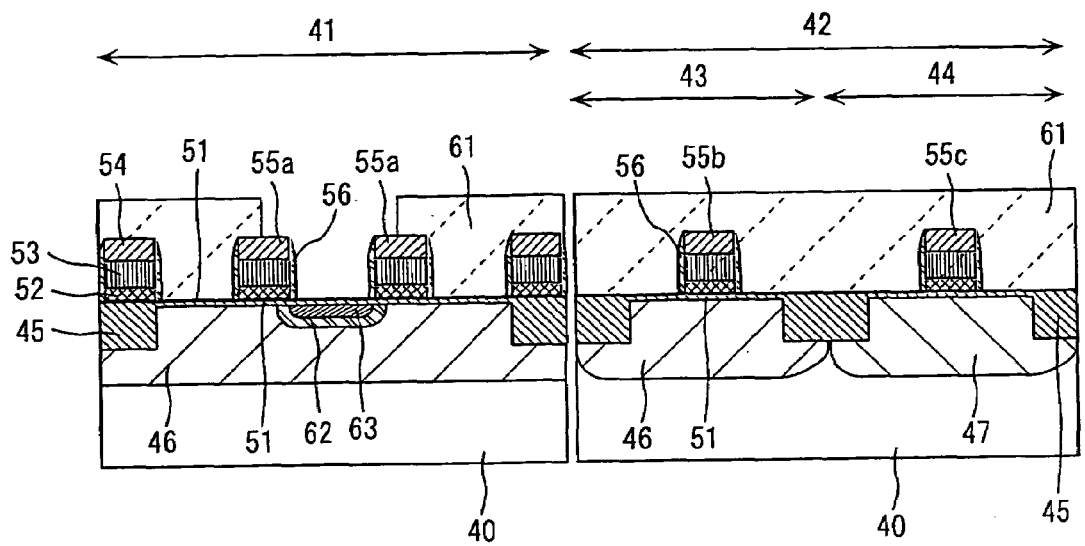
FIG. 6 is a cross sectional view showing a manufacturing step in a preferred embodiment of a semiconductor device according to the invention.

Then, as shown in FIG. 6, p-type impurities, for example, boron ions were implanted to the p-type well region 46 between the two gate electrodes 55a to be connected with a data line in a memory array section 41 subsequently by $1.5 \times 10^{13}$ cm$^{-2}$ at an energy of 20 KeV to form a p-type semiconductor region 62 using the photoresist 61 as a mask. Successively, n-type impurities, for example, arsenic were implanted by $1 \times 10^{13}$ cm$^{-2}$ at an energy of 40 KeV to form an n-type semiconductor region 63 in the p-type semiconductor region 62. In this case, scattering of the distribution of the impurities can be suppressed more by implanting each of the impurity ions in a direction perpendicular to the silicon substrate with no inclination.

The threshold voltage of the MISFET in the memory array section 41 is determined based on the concentration of the voltage controlling impurity ions 48 implanted to the entire surface for the memory array section 41, the concentration of boron implanted in the p-type semiconductor region 62 and the concentration of arsenic implanted in the n-type semiconductor region 63 for voltage control. Accordingly, to obtain a desired threshold voltage, other conditions than those described above may also be used for the ion implantation conditions for boron ions and arsenic ions. Further, other p-type impurities than boron may also be used as the p-type impurities in the same manner. Other n-type impurities than arsenic may also be used as the n-type impurities.

Figure 7:
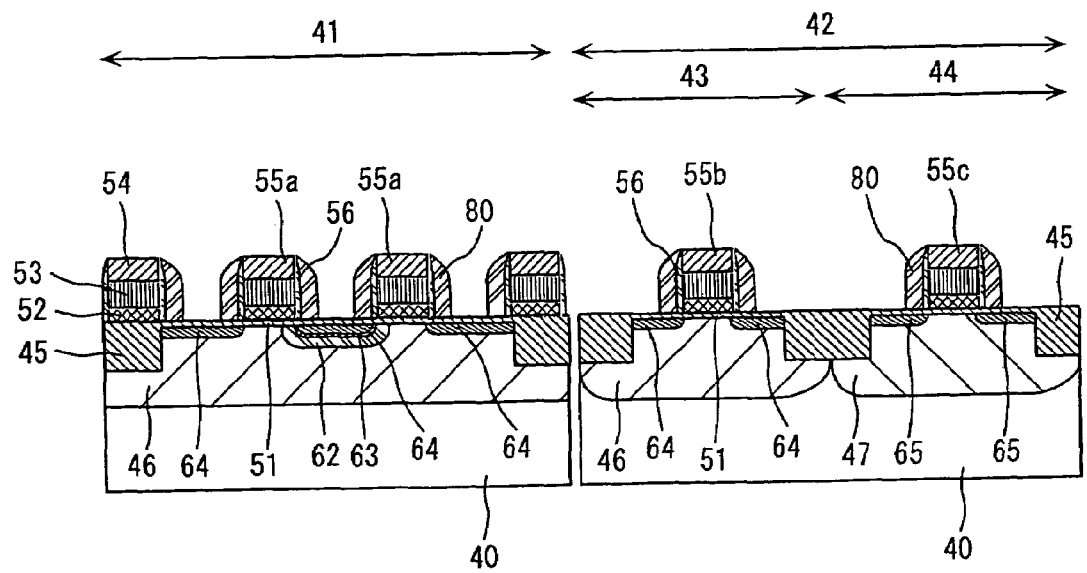
FIG. 7 is a cross sectional view showing a manufacturing step in a preferred embodiment of a semiconductor device according to the invention.

Then, as shown in FIG. 7, after removing the photoresist 61, n-type impurities, for example, phosphorus were implanted to the p-type well region 46 to form n-type semiconductor regions 64 above the p-type well regions 46 on both sides of the gate electrodes 55a in the memory array section 41 and above the p-type well regions 46 on both sides of the gate electrode 55b in the n-type MISFET forming portion 43. In this step, the n-type semiconductor regions 64 in the memory array section 41 and the n-type conductor regions 64 in the n-type MISFET forming portion 43 were formed simultaneously but they may be formed under different conditions, respectively.

Further, p-type semiconductor regions 65 were formed in the n-type well region 47 above the n-type well region 47 on both sides of the gate electrode 55c by implanting p-type impurities, for example, boron ions.

Successively, a silicon nitride film of about 60 nm was deposited above the silicon substrate 40 by a CVD method and etched anisotropically to form side wall spacers 80 at the surface of the anti-oxidation film 56 on the lateral side of the gate electrodes 55a, 55b, and 55c.

Figure 8:
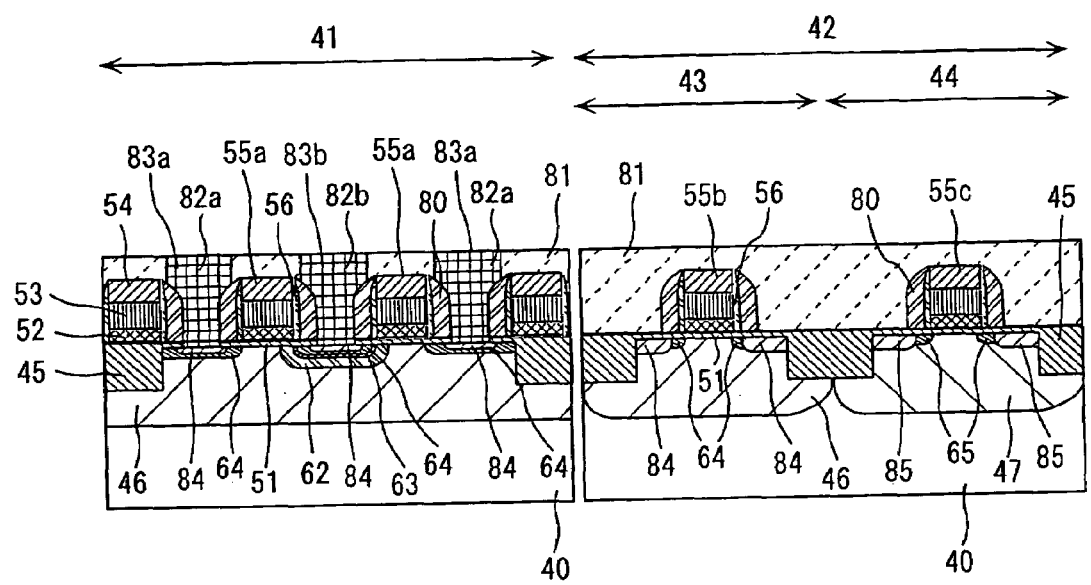
FIG. 8 is a cross sectional view showing a manufacturing step in a preferred embodiment of a semiconductor device according to the invention.

Then, as shown in FIG. 8, n-type impurities, for example, arsenic ions were implanted to the p-type well regions 46 of the peripheral circuit portion 42, to form n$^+$-type semiconductor regions 84. Further, p$^+$-type semiconductor regions 85 were formed by ion implanting p-type impurities, for example, boron ions to the n-well regions 47 in the peripheral circuit portion 42.

Then, after forming the silicon oxide film as an interlayer insulative film 81 above the silicon substrate 40, for example, by a plasma CVD method, it was polished by a chemical mechanical polishing method (CMP) to flatten the surface. Successively, in the memory array section 41, the interlayer insulation film 81 and the silicon oxide film 51 were removed by dry etching using a photoresist pattern as a mask to form contact holes 82a reaching the n-type semiconductor regions 64. Further, also in the region where the n-type semiconductor region 63 was formed, a contact hole 82b reaching there was formed in the same manner. Since the etching is conducted under the condition of high etching selectivity between the silicon oxide film forming the interlayer insulative film 81 and the silicon nitride film forming the side wall spacer 80, contact holes 82a and 80b each having a fine apertured diameter were formed in a self-alignment manner.

In this case, phosphorus ions, for example, may be ion implanted to the contact holes 82a, 82b to form an electric field moderation region above the n-type semiconductor regions 63 and 64. The electric field moderation region may be formed also by ion implantation for several times. Further, the region may also be formed by using n-type impurities other than phosphorus. Successively, plugs 83a and 83b were formed inside the contact holes 82a and 82b. The plugs 83a and 83b comprised, for example, of polycrystalline silicon with addition of phosphorus at about $1 \times 10^{20}$ cm$^{-3}$ which were deposited by the CVD method and then polished at the surface by a CMP method and buried in the contact holes 82a and 82b. Phosphorus ions in the plugs 83a and 83b were diffused to form n$^+$-type semiconductor regions 84 over the n-type diffusion regions 63 and 64.

Figure 9:
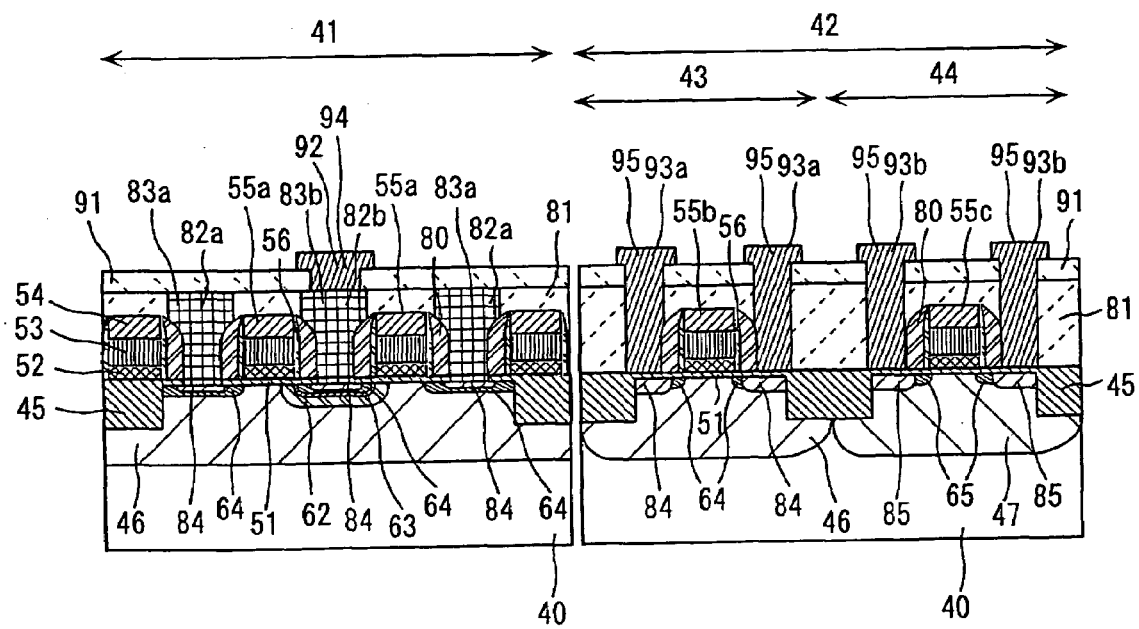
FIG. 9 is a cross sectional view showing a manufacturing step in a preferred embodiment of a semiconductor device according to the invention

Then, as shown in FIG. 9, an interlayer insulative film 91 comprising a silicon oxide film was formed over the interlayer insulative film 81, for example, by a CVD method.

Then, the interlayer insulative film 91 above the contact hole 82b is removed by dry etching using a photoresist pattern as a mask to form a through hole 92 and expose the surface of the plug 83b. Further, also in the peripheral circuit portion 42, the interlayer insulative films 91, 81 were removed by dry etching using a photoresist pattern as a mask, and the silicon oxide film 51 was removed to form contact holes 93a reaching the n$^+$-semiconductor regions 84 of the n-type MISFET forming portion 43, and contact holes 93b reaching the p$^+$-type semiconductor regions 85 of the p-type MISFET forming portion 44. Then, a data line 94 in contact with the plug 83b through the through hole 92 was formed, and first layer interconnections 95 in connection with the n$^+$-type semiconductor regions 84 in the n-type MISFET forming portion 43 through the contact holes 93a, and first layer interlayer connections 95 in connection with the p$^+$-type semiconductor regions 85 in the p-type MISFET forming portion 44 through the contact hole 93b were formed. The data line 94 and the first layer interconnections 95 were formed, for example, by depositing a conductive film, for example, made of tungsten and then delineating the conductive film by using a photoresist pattern as a mask. The peripheral circuit portion 42 was completed by the steps so far.

Figure 10:
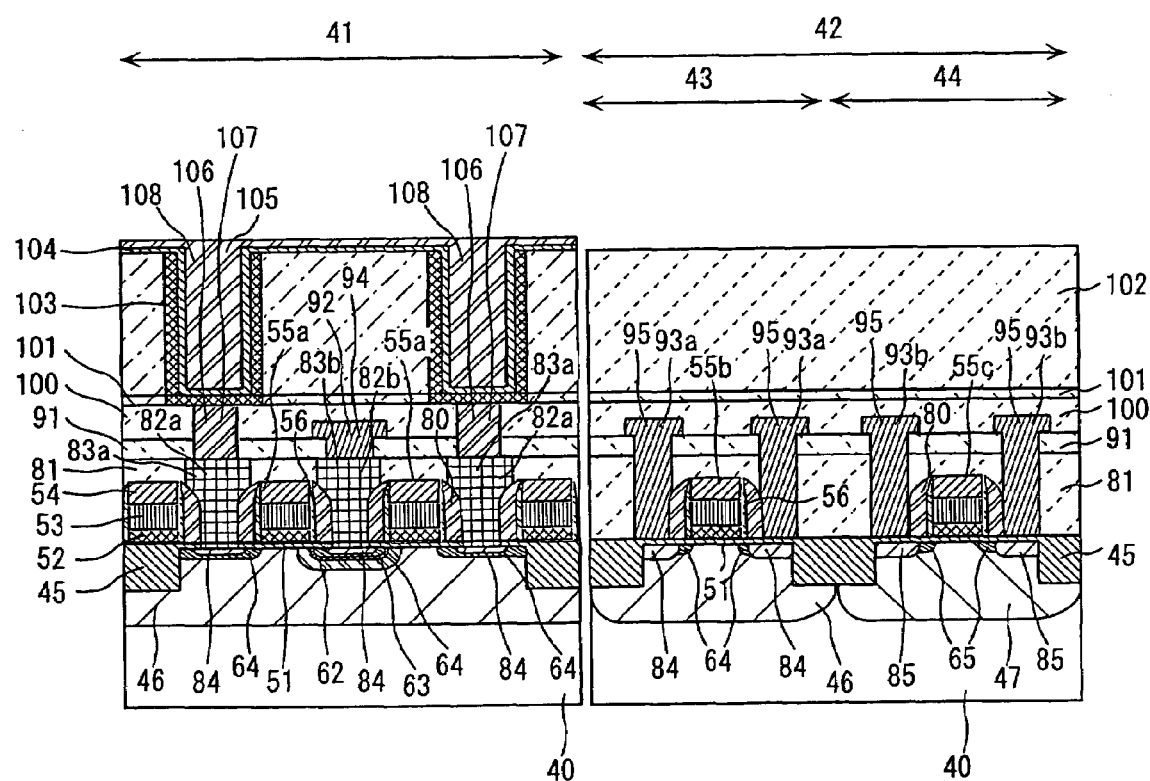
FIG. 10 is a cross sectional view showing a manufacturing step in a preferred embodiment of a semiconductor device according to the invention.

Then, as shown in FIG. 10, an interlayer insulative film 100 comprising a silicon oxide film was formed over the data line 94 and the first layer interconnections 95, for example, by a plasma CVD method. The surface of the interlayer insulative film 100 was planarized by a CMP method. Then, the interlayer insulative films 100 and 91 were removed successively using a photoresist pattern as a mask to form through holes 106 reaching the plugs 83*a*. Then, a conductive film such as made of polycrystalline silicon tungsten was buried in the through holes 106 by a CVD method or the like, to form plugs 107. Then, an interlayer insulative film 100 comprising a silicon nitride film was deposited above the plug 107 and the interlayer insulative film 102 by a CVD method was deposited. Successively, the interlayer insulative films 102, 101 were etched by using a photoresist pattern as a mask to form grooves 108 above the plugs 107. Then, a lower electrode 103 comprising, for example, polycrystalline silicon with addition of phosphorus was formed to the inner wall in the groove. In this case, while polycrystalline silicon was formed also above the interlayer insulative film 102, this was removed by etching back after burying the photoresist or the like inside the groove.

Then, a capacitor dielectric film 104 comprising, for example, tantalum oxide was formed over the lower electrode 103, and an upper electrode 105 made of, for example, titanium nitride was formed over the capacitor dielectric film 104. A memory cell of DRAM was completed by the steps so far.

Then, although not illustrated, an interlayer insulative film was formed and a wiring at the second layer was formed to complete the DRAM in this embodiment.

As described above, according to this embodiment, scattering in the side wall oxide film of the gate electrode constituting a main factor of the scattering of the threshold voltage of the MISFET in the memory cell can be removed in the asymmetrical diffusion region structure of the DRAM memory cell. This can provide a semiconductor device having an asymmetrical diffusion region structure with less scattering of the threshold voltage of the MISFET in the memory cell.

This was because the anti-oxidation film was formed to the side wall of the gate electrode.

One of the most significant factors of the scattering of the threshold voltage of the MISFET in the memory cell is the scattering of thickness of the gate electrode side wall oxide film. The gate electrode side wall was oxidized during so-called light oxidation. While the light oxidation is a step indispensable for removing etching damages of the gate insulative film at the gate edge, not only the gate edge but also the side wall of the gate electrode are oxidized in this step. In the case of oxidizing the gate electrode comprising polycrystalline silicon with addition of impurities, since impurities such as phosphorus are added and since the electrode was formed of polycrystal, scattering in the thickness of the formed oxide film was as large as about 15% of the film thickness. However, in the case of forming the anti-oxidation film on the side wall of the gate electrode, for example, by a CVD method, scattering of the thickness was about 5% for the film thickness and the scattering of the film thickness of the gate electrode side wall can be decreased to ⅓. Further, scattering of the gate length caused by irregular oxidation of the gate electrode during oxidation step can also be decreased to some extent.

That is, in the non-symmetric structure, assuming the scattering of the threshold voltage, for example, as 100 mV, since the anti-oxidation film was formed to the side wall, this can be decreased to about 65 mV. As described above, the invention can provide a semiconductor device with less scattering of the threshold voltage of the MISFET in the memory cell.

Further, since the anti-oxidation film for the gate electrode side wall is formed before asymmetric ion implantation, the position at which the impurity ions are implanted was spaced apart from the gate edge by the thickness of the side wall anti-oxidation film. In the case of ion implantation after fabrication of the gate electrode but before oxidation of the side wall or forming the anti-oxidation film, since the position for the gate edge defines the position of implanting the impurities, scattering of the gate length was extremely large due to the short channel effect to increase the scattering of the threshold voltage of the MISFET.

Accordingly, forming of the side wall anti-oxidation film before asymmetric ion implantation can also provide an effect of decreasing the influence of the gate length scattering on the scattering of the threshold voltage of the MISFET in the memory cell.

Further, since the side wall anti-oxidation film is formed before the asymmetric ion implantation, this can prevent damages given to the gate insulative film at the gate edges upon ion implantation or, in the case of using tungsten or tungsten silicide for the gate electrode material, this can prevent exposed tungsten atoms from entering into the semiconductor substrate being hit by the ions upon ion implantation, and contaminating the semiconductor substrate.

As described above, use of the method of this embodiment can provide a semiconductor device having an asymmetric diffusion region structure with less scattering of the threshold voltage of the MISFET in the memory cell and having high reliability.

Figure 11:
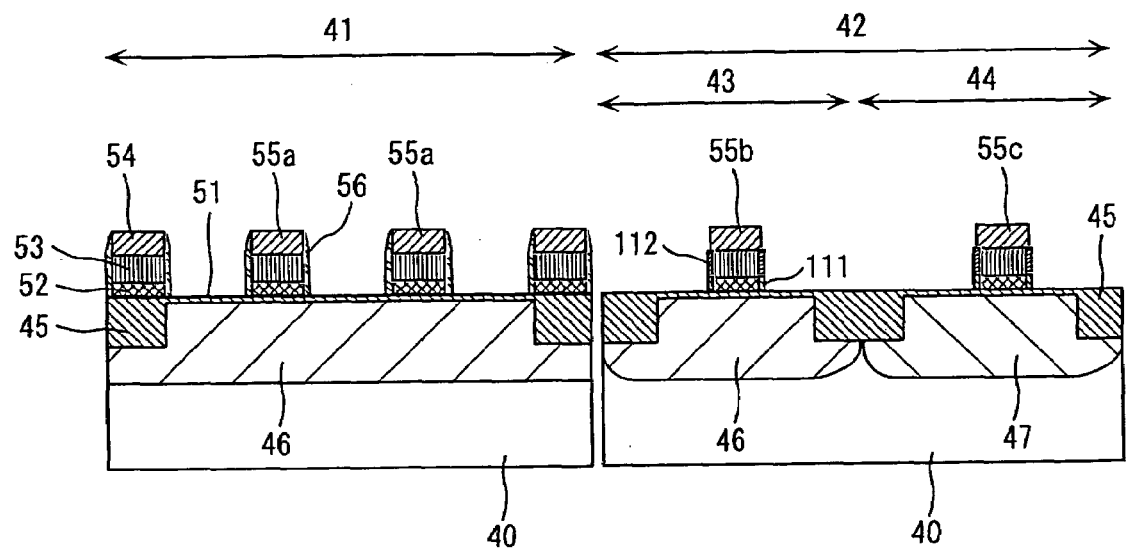
FIG. 11 is a cross sectional view showing a manufacturing step in a preferred embodiment of a semiconductor device according to the invention.

Although in Embodiment 1 the anti-oxidation film 56 was formed to all of the side walls for the electrodes 55*a*, 55*b*, and 55*c* in the memory array section 41 and the peripheral circuit portion 42 but, as shown in FIG. 11, the anti-oxidation film 56 may be formed only to the gate electrode 55*a* and may not be formed to the side wall for the gate electrodes 55*b*, 55*c* in the peripheral circuit portion 42. In this case, a tungsten oxide film 111 was formed on the side wall of the polycrystalline silicon film 52 and a tungsten oxide film 112 was formed on the side wall of the tungsten silicide film 53 forming the gate electrodes 55*b* and 55*c* in the peripheral circuit portion 42 by light oxidation. In the peripheral circuit 42, since the impurity concentration was substantially equal between the two diffusion regions on both sides of the gate electrodes 55*b* and 55*c* (not in asymmetric diffusion region structure), scattering of the gate length was predominant in the scattering of the threshold voltage of the n-type MISFET and the p-type MISFET. Then, even when the side wall of the gate electrode was oxidized, the effect of scattering of the side wall oxide film of the gate electrode provides not substantial problem. Accordingly, also the embodiment shown in FIG. 11 can provide the effect intended in the invention of decreasing the scattering for the threshold voltage of the MISFET in the memory.

Embodiment 1 showed a case of adding phosphorus as n-type impurities to the polycrystalline silicon film 52 of the gate electrode 55c for the p-type MISFET forming portion 44 in the peripheral circuit portion 42, but an identical effect can be obtained also in the case of using a so-called dual gate structure in which boron as p-type impurities was added to the polycrystalline silicon film 52 of the gate electrode 55c for the p-type MISFET forming portion 44 by using the same method.

In Embodiment 1, a silicon nitride film formed by a CVD method was applied as the anti-oxidation film 56, but any other film may be used so long as it has a performance of preventing oxidation of the gate electrode in the light oxidation. In addition, after forming the gate electrode, the side wall for the gate electrode may be nitrided by applying nitridation, thereby preventing the gate electrode side wall from oxidation during light oxidation.

As a method of nitridation, it is preferred to use, for example, plasma nitridation at low temperature or nitridation using nitrogen radicals in the case of using the dual gate structure for the peripheral circuit portion to prevent the diffusion of boron by thermal diffusion from the polycrystalline silicon film 52 with addition of boron constituting the gate electrode 55c of the p-type MISFET forming portion 44.

Embodiment 1 showed a case of using a polyside structure comprising a polycrystalline silicon film with addition of impurities and a tungsten silicide film as the gate electrode, but an identical effect can be obtained also in a poly-metal structure as a stacked structure of a polycrystalline silicon film with addition of impurities and a metal film such as made of tungsten by applying the same method.

In Embodiment 1, the side wall of the gate electrode is sometimes oxidized slightly (2 nm or less) in the step of dry etching and cleaning upon fabrication of the gate electrode to a desired shape. In this case, a thin silicon oxide film of 2 nm. or less remains at the boundary between the anti-oxidation film 56 and the gate electrode 55. Since the thickness of the oxide film formed on the boundary is thin (2 nm or less), the scattering of the film thickness is small and gives less effect on the scattering of the threshold voltage in the MISFET. Accordingly, an identical effect can be obtained also in the case where a thin (2 nm or less) oxide film is formed between the gate electrode 55a and the anti-oxidation film 56.

Embodiment 2

Figure 12:
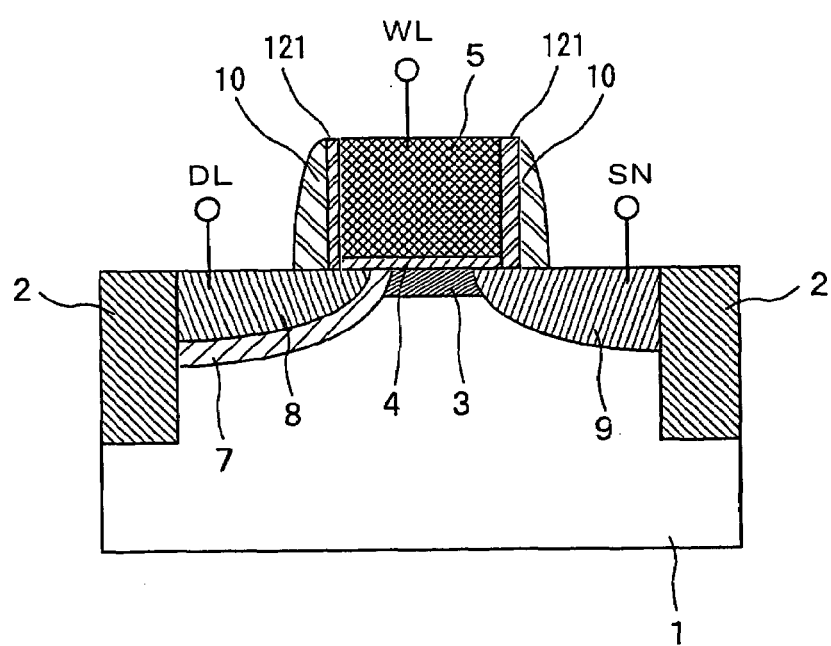
FIG. 12 is a cross sectional view showing another preferred embodiment of a semiconductor device according to the invention.

FIG. 12 is across sectional view showing an embodiment of a semiconductor device according to the invention. Like in Embodiment 1 described above, a device isolation trench 2 each comprising a silicon oxide film is formed on a semiconductor substrate 1 comprising single crystalline silicon. A p-type semiconductor region 3 is formed on the surface of the semiconductor substrate 1, and a gate dielectric film 4 comprising silicon oxide and a gate electrode 5 are formed on the p-type semiconductor region 3. The gate electrode 5 is formed of polycrystalline silicon with addition of n-type impurity, on which a tungsten silicide film was formed with an aim of reducing the resistance. A silicon oxide film 121 was formed to the side wall in the direction of the gate length of the gate electrode, for example, by a CVD method. The silicon oxide film 121 is formed before light oxidation. Then, impurities forming the source and drain of MISFET are ion implanted. In one region forming the source and drain of the MISFET, a p-type semiconductor region 7 and an n-type semiconductor region 8 were formed with an aim of controlling the threshold voltage of the MISFET and, further, an n-type semiconductor region 9 is formed in the other region forming the source and the drain. The concentration of the p-type impurities in the p-type semiconductor region 7 is higher than the concentration of the p-type impurities in the p-type semiconductor region 3. The concentration of the n-type impurities in the n-type semiconductor region 8 is higher than the concentration of the n-type impurity in the n-type semiconductor region 9. The one region forming the source and drain comprising the p-type semiconductor region 7 and the n-type semiconductor region 8 is connected by way of a plug, for example, comprising polycrystalline silicon with addition of n-type impurities to a data line (DL). Further, the n-type semiconductor region 9 is connected with a capacitor (SN) for storing static charges by way of a plug comprising, for example, polycrystalline silicon with addition of n-type impurities. A side wall spacer 10 comprising a silicon nitride film is formed on the side wall in the gate length direction of the anti-oxidation film 121.

In Embodiment 1, the anti-oxidation film 6 is formed on the side wall of the gate electrode 5 but Embodiment 2 is different in that the silicon oxide film 121 is formed on the side wall of the gate electrode 5. In the case of forming the silicon oxide film for the side wall of the gate electrode, for example, by the CVD method, since the scattering of the thickness does not depend on the impurity concentration or the crystal face orientation in the polycrystalline silicon film constituting the gate electrode, scattering of the thickness is smaller than in the case of forming the film by thermal oxidation.

In the case of forming the silicon oxide film, for example, by the CVD method, scattering of the thickness is about 5% for the film thickness. The speed of oxygen passing through the silicon oxide film is higher compared with that through the anti-oxidation film. However, when compared with the case where the gate electrode is oxidized in an exposed state, the oxidation speed is lowered. For example, in the case of applying a thermal treatment in an oxygen atmosphere in a state where the gate electrode is exposed, the film thickness is about 10 nm and the scattering is about 1.5 nm. On the other hand, in the case where an oxide film is formed by about 10 nm by the CVD method previously to the side wall of the gate electrode, the thickness of the oxide film formed by oxidation is about 4 nm and scattering in the film thickness is about 1 nm even combined with the scattering of the thickness of the oxide film formed by the CVD method. Accordingly, scattering of the thickness of the side wall oxide film can be suppressed more by using the method of this embodiment compared with the exisiting method.

In this case, assuming the scattering of the threshold voltage for example as 100 mV, it can be decreased to about 75 mV by forming the oxide film on the sidewall, for example, by a CVD method.

As described above, scattering of the threshold voltage of the MISFET in the memory cell can be reduced in the asymmetrical diffusion region structure by using the method of this embodiment.

In Embodiment 2, light oxidation was applied after forming the silicon oxide film 121 to the side wall of the gate electrode 5, but nitridation may be applied after forming the silicon oxide film 121, for example, by a CVD method to introduce nitrogen to the boundary between the gate electrode and the silicon oxide film 121. By using the method, the surface of the gate electrode is less oxidized by the subsequent light oxidation, thereby enabling to decrease the scattering of the film thickness on the side wall of the gate electrode. This can decrease the scattering of the threshold voltage of the MISFET in the memory cell.

Reference numerals used in the drawing of the application are to be described below.

1 semiconductor substrate
2 device isolation trench
3 p-type semiconductor region
4 gate oxide film
5 gate dielectric film
6 anti-oxidation film
7 p-type semiconductor region
8, 9 n-type semiconductor region
10 side wall spacer
20 gate oxide film
21 polycrystalline silicon film
22 tungsten silicide film
23 silicon nitride film
24 gate electrode side wall oxide film
25 through oxide film
26 side wall spacer
27 gate electrode
40 silicon substrate
41 memory array portion
42 peripheral circuit portion
43 n-type MISFET forming portion
44 p-type MISFET forming portion
45 device isolation trench
46 p-type well region
47 n-type well region
48 impurity ions for threshold voltage control
51 silicon oxide film
52 polycrystalline silicon film
53 tungsten silicide film
54 silicon nitride film
55a, 55b, 55c gate electrode
56 anti-oxidation film
61 photoresist
62 p-type semiconductor region
63, 64 n-type semiconductor region
65 p-type semiconductor region
80 side wall spacer
81 interlayer insulative film
82a, 82b contact hole
83a, 83b plug
84 n⁺-type semiconductor region
84 p⁺-type semiconductor region
91 interlayer insulation film
92 through hole
93a, 93b contact hole
94 data line
95 first layer interconnection
100, 101, 102 interlayer insulation film
103 lower electrode
104 capacitor dielectric film
105 upper electrode
106 through hole
107 plug
108 trench
111 silicon oxide film
112 tungsten oxide film
121 silicon oxide film

What is claimed is:

1. A semiconductor device comprising:
a first impurity diffusion region and a second impurity diffusion region each having a first conduction type formed on one main surface of a semiconductor substrate at a predetermined distance;
a channel region formed in a third impurity diffusion region of the semiconductor substrate which has a second conduction type opposite to the first conduction type and is formed between the first impurity diffusion region and the second impurity diffusion region;
a fourth impurity diffusion region having the second conduction type and being formed between the first impurity diffusion region and the substrate as well as between the first and third impurity diffusion regions; and
a MISFET formed by stacking a gate electrode by way of a gate dielectric film above the channel region and portions of the first impurity diffusion region and the second impurity diffusion region, wherein
the first impurity diffusion region is formed with an impurity concentration higher than an impurity concentration of the second impurity diffusion region, and the third diffusion impurity diffusion region is formed with an impurity concentration lower than an impurity concentration of the fourth impurity diffusion region, and
an anti-oxidation film deposited by a CVD method on a side wall of the gate electrode is formed to prevent polysilicon of the gate electrode from being oxidized during a light oxidation treatment.

2. A semiconductor device comprising:
a first impurity diffusion region and a second impurity diffusion region having a first conduction type but different impurity concentrations and respectively formed on one main surface of a semiconductor substrate at a predetermined distance from each other;
a channel region formed in a third impurity diffusion region of the semiconductor substrate which has a second conduction type opposite to the first conduction type and is formed between the first impurity diffusion region and the second impurity diffusion region;
a fourth impurity diffusion region having the second conduction type and being formed between the first impurity diffusion region and the substrate as well as between the first and third impurity diffusion regions; and
an MISFET formed by stacking a gate electrode by way of a gate dielectric film above the channel region and portions of the first and second impurity diffusion regions;
wherein an impurity concentration of the third impurity diffusion region is lower than an impurity concentration of the fourth impurity diffusion region, and
an anti-oxidation film deposited by a deposition method on a side wall of the gate electrode is formed to prevent polysilicon of the gate electrode from being oxidized during a light oxidation treatment.

3. A semiconductor device according to claim 1, wherein the film deposited by a CVD method is a silicon nitride film.

4. A semiconductor device according to claim 2, wherein the film deposited by a deposition method is a silicon oxide film.

5. A semiconductor device having a DRAM memory cell including a MISFET, an information storage capacitor portion and an information transfer data line formed respectively over a semiconductor substrate,
wherein
the MISFET has a first impurity diffusion region for connecting the MISFET with the information storage capacitor portion and a second impurity diffusion region for connecting the information transfer data line with the MISFET,
the second impurity diffusion region is formed with a first conductive type as the first impurity diffusion region and an impurity concentration higher than that of the first impurity diffusion region, a channel region formed in a third impurity diffusion region of the semiconductor substrate which has a second conduction type opposite to the first conduction type and is formed between the first impurity diffusion region and the second impurity diffusion region;

a fourth impurity diffusion region having the second conduction type, having an impurity concentration higher than that of the third impurity diffusion region, and being formed between the first impurity diffusion region and the substrate as well as between the first and third impurity diffusion regions; and a film deposited by a CVD method on a side wall of the gate electrode and formed to prevent polysilicon of the gate electrode from being oxidized during a light oxidation treatment, wherein the gate electrode is formed by stacking a gate dielectric film over the channel region and portions of the first impurity diffusion region and the second impurity diffusion region.

* * * * *